United States Patent
Chen et al.

(10) Patent No.: US 9,245,608 B2
(45) Date of Patent: Jan. 26, 2016

(54) THERMALLY TOLERANT PERPENDICULAR MAGNETIC ANISOTROPY COUPLED ELEMENTS FOR SPIN-TRANSFER TORQUE SWITCHING DEVICE

(75) Inventors: Wei-Chuan Chen, San Diego, CA (US); Kangho Lee, San Diego, CA (US); Xiaochun Zhu, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 295 days.

(21) Appl. No.: 13/571,406

(22) Filed: Aug. 10, 2012

(65) Prior Publication Data

US 2013/0075845 A1 Mar. 28, 2013

Related U.S. Application Data

(60) Provisional application No. 61/537,778, filed on Sep. 22, 2011.

(51) Int. Cl.
*H01L 43/08* (2006.01)
*G11C 11/16* (2006.01)
*G11C 11/15* (2006.01)

(52) U.S. Cl.
CPC ............ *G11C 11/161* (2013.01); *G11C 11/15* (2013.01); *G11C 11/16* (2013.01); *H01L 43/08* (2013.01)

(58) Field of Classification Search
CPC ............... G11C 11/14–11/16; G11C 11/161; H01L 43/08; H01L 43/10; H01L 43/12
USPC ............ 257/421, E43.004–E43.006; 365/158, 365/171, 173
See application file for complete search history.

(56) References Cited

U.S. PATENT DOCUMENTS

| | | | |
|---|---|---|---|
| 7,593,196 B2 | 9/2009 | Gill | |
| 7,630,232 B2 * | 12/2009 | Guo | ............................ 365/158 |
| 2006/0081953 A1 | 4/2006 | Nguyen et al. | |
| 2009/0080239 A1 | 3/2009 | Nagase et al. | |
| 2009/0147567 A1 | 6/2009 | Chen | |
| 2009/0256220 A1 | 10/2009 | Horng et al. | |
| 2011/0141803 A1 * | 6/2011 | Kim et al. | .................... 365/171 |
| 2011/0159316 A1 | 6/2011 | Wang et al. | |

(Continued)

FOREIGN PATENT DOCUMENTS

| | | |
|---|---|---|
| JP | 2012235015 A | 11/2012 |
| WO | WO-2011111473 A1 | 9/2011 |

OTHER PUBLICATIONS

Hayakawa et. al, Current Induced Magnetization Switching in MgO Bartrier Magnetic Tunnel Junctions with CoFeB-Based Synthetic Ferrimagnetic Free Layers, IEEE Transactions on Magnetics, vol. 44, No. 7, Jul. 2008.*

(Continued)

*Primary Examiner* — Allison P Bernstein
(74) *Attorney, Agent, or Firm* — Donald D. Min; Paul Holdaway

(57) ABSTRACT

Perpendicular magnetic anisotropy (PMA) type magnetic random access memory cells are constructed with a composite PMA layer to provide a magnetic tunnel junction (MTJ) with an acceptable thermal barrier. A PMA coupling layer is deposited between a first PMA layer and a second PMA layer to form the composite PMA layer. The composite PMA layer may be incorporated in PMA type MRAM cells or in-plane type MRAM cells.

16 Claims, 6 Drawing Sheets

(56) References Cited

U.S. PATENT DOCUMENTS

2012/0126905 A1* 5/2012 Zhang et al. .................. 331/94.1
2012/0280336 A1* 11/2012 Jan et al. ........................ 257/421
2012/0281462 A1 11/2012 Bessho et al.
2012/0320666 A1 12/2012 Ohno et al.

OTHER PUBLICATIONS

Shan et al., "Magnetism of rare-earth—transition-metal nanoscale mulitlayers" Physical Review B, vol. 42, No. 16, Dec. 1, 1990, pp. 10 433-10 445.*

Tunnel Magnetoresistance in MgO-Barrier Magnetic Tunnel Junctions With BCC-COFE(B) and FCC-COFE Free Layers; Ikeda, S.; Hayakawa, J.; Lee, Y.M.; Tanikawa, T.; Matsukura, F.; Ohno; H. Source: Journal of Applied Physics, v 99, n 8, 8A907-1-3, Apr. 15, 2006.

COFEB Inserted Perpendicular Magnetic Tunnel Junctions With COFE/PD Multilayers for High Tunnel Magnetoresistance Ratio; Mizunuma, Kotaro; Ikeda, Shoji; Yamamoto, Hiroyuki; Gan, Hua Dong; Miura, Katsuya; Source: Japanese Journal of Applied Physics, v 49, n 4 Part 2, Apr. 2010.

International Search Report and Written Opinion—PCT/US2012/056779—ISA/EPO—Jan. 9, 2013.

* cited by examiner

THERMALLY TOLERANT PERPENDICULAR MAGNETIC ANISOTROPY COUPLED ELEMENTS FOR SPIN-TRANSFER TORQUE SWITCHING DEVICE

CROSS REFERENCE TO RELATED APPLICATIONS

The present application claims the benefit of U.S. provisional patent application No. 61/537,778 in the names of CHEN et al., filed Sep. 22, 2011.

TECHNICAL FIELD

The present disclosure generally relates to Magnetic Tunnel unction (MTJ) devices. More specifically, the present disclosure relates to increasing thermal stability of PMA type MTJ devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnetization or "0" when the free layer magnetization is parallel to the fixed layer magnetization or vice versa. One such device having a fixed layer, a tunneling layer, and a free layer is a magnetic tunnel junction (MTJ). The electrical resistance of an MTJ depends on whether the free layer magnitization and fixed layer magnitization are parallall or antiparallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current may flow through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

Bitcells of a magnetic random access memory may be arranged in one or more arrays including a pattern of memory elements (e.g., MTJs in case of MRAM). STT-MRAM (Spin-Transfer-Torque Magnetic Random Access Memory) is an emerging nonvolatile memory that has advantages of nonvolatility, comparable speed to eDRAM (Embedded Dynamic Random Access Memory), smaller chip size compared to eSRAM (Embedded Static Random Access Memory), unlimited read/write endurance, and low array leakage current.

BRIEF SUMMARY

According to an aspect of the present disclosure, a magnetic tunnel junction (MTJ) is configured with a reference layer, a tunnel barrier layer and a composite perpendicular magnetic anisotropy (PMA) layer including a. first PMA layer, a second PMA laver, and a PMA coupling layer between the first PMA layer and the second PMA layer. According to this aspect, the tunnel barrier layer is configured between the reference layer and the composite PMA layer.

Other aspects of the present disclosure include a method of constructing a perpendicular MTJ. The method includes depositing a reference layer, depositing a tunnel barrier layer and depositing a composite perpendicular magnetic anisotropy (PMA) layer. Depositing the PMA layer includes depositing a first PMA layer, depositing a second PMA layer, and depositing a PMA coupling layer between the first PMA layer and the second PMA layer. In this aspect, the tunnel barrier layer is deposited between the reference layer and the composite PMA layer.

In another aspect, a magnetic tunnel junction (MTJ) has means for fixing magnetization in a first layer, and means for providing tunneling magnetoresistance (TMR) in a second layer. The apparatus also has means for increasing perpendicular magnetic anisotropy (PMA) in a composite layer. The composite layer includes a first means for increasing PMA, a second means for increasing PMA, and a means for coupling the first means for increasing PMA and the second means for increasing PMA.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
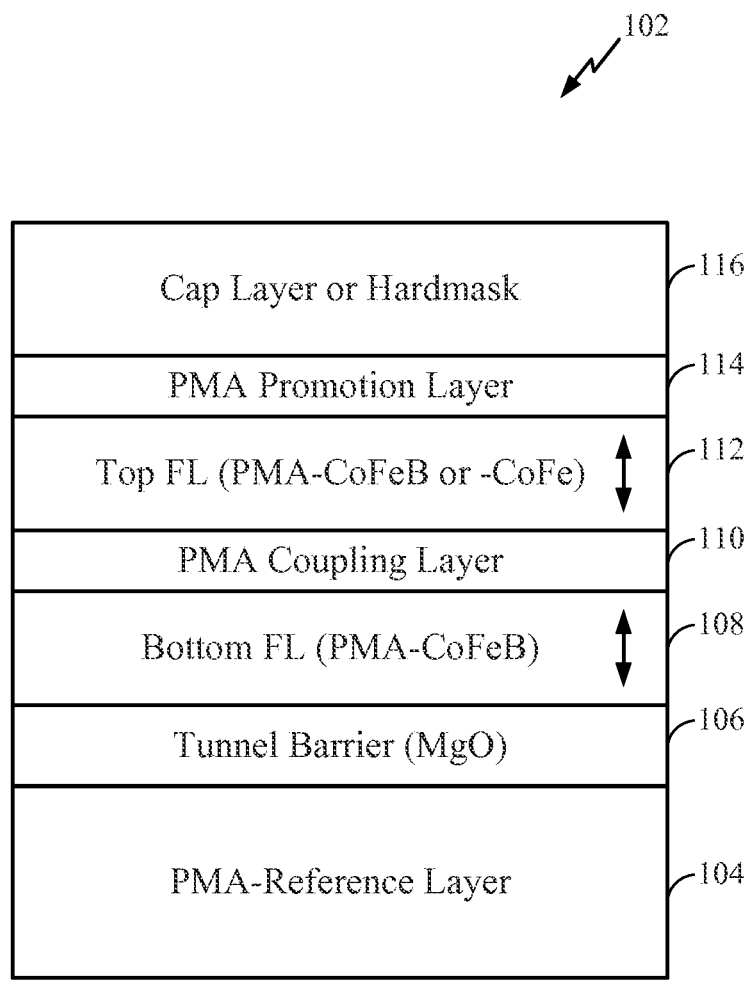
FIG. 1 is a cross-sectional diagram of a magnetic tunnel junction (MTJ) structure according to aspects of the present disclosure.

In one category of MRAM cells, a direction of polarization of the free layer and the reference layer of a magnetic tunnel junction (MTJ) is parallel to the plane of the respective layer. Such memory cells are referred to as having in-plane magnetic anisotropy or longitudinal magnetic anisotropy (LMA). The direction of magnetic polarization of MRAM cells with in-plane magnetic anisotropy is provided by constructing memory cells with an elongated shape, such as an ellipse. The elongated shape provides pole locations at each end for the magnetic moment to tend toward or away from.

In another category of MRAM cells, the direction of polarization of the free layer and reference layer of an MTJ is perpendicular to the plane of the respective layer. Such memory cells are referred to as having perpendicular magnetic anisotropy (PMA). The direction of magnetic polarization in a layer of a PMA type MRAM cell is inherently directional, i.e., perpendicular to the layer. Therefore the PMA type MRAM cells can have a symmetric shape, such as a circular shape, that can be more easily fabricated than elongated in-plane MRAM cells.

Circular shaped PMA type MRAM cells have a smaller area than elongated in-plane MRAM cells and therefore may facilitate the development of more deeply scaled memory devices. Also, because the switching current of an MRAM cell is proportional to its area, PMA type MRAM cells may consume less power than in-plane type MRAM cells.

The polarization of the free layer and reference layer corresponds to the magnetic moments in the materials of corresponding layers. One challenge to the development of PMA type MRAM is presented by a tendency of magnetic moments in thin films to align along the film layer so that at least a component of the magnetic moment stays mostly in the layer. This tendency which is referred to as "in-plane magnetic anisotropy" can be overcome by application of a strong perpendicular magnetic anisotropy. One way to apply a strong perpendicular magnetic anisotropy is to use a material that exhibits very strong crystalline anisotropy and has a net magnetic moment that is perpendicular to the plane of the thin film layer. The net perpendicular magnetic moment of such a crystalline material may be stronger than the in-plane magnetic anisotropy. However, materials that exhibit strong crystalline anisotropy are not very compatible with existing CMOS (complementary metal oxide semiconductor) fabrication processes.

CoFeB is a material that is compatible with CMOS processing and is commonly used for in-plane type MRAM cells. For example, the free layer of an in-plane type MRAM cell is usually a 2 nm thick layer of CoFeB. CoFeB does not exhibit strong crystalline anisotropy and/or surface anisotropy so the orientation of magnetization in the material tends to stay in the film layer due to the demagnetizing field. However, it has been observed that the in-plane anisotropy of CoFeB may be overcome by decreasing the film thickness and increasing iron content. By using a very thin layer of CoFeB, film properties that are usually dominated by the surface anisotropy of the film are instead dominated by the bulk crystalline anisotropy of the film. Such a very thin layer of CoFeB layer used in combination with an MgO barrier layer has been observed to exhibit PMA.

The thermal barrier of an MRAM cell that is constructed with such a very thin layer of CoFeB is undesirably low because the thermal bather is based on the volume of the memory cell. For example, a thermal barrier of about 40 kT has been observed in such PMA type memory cells constructed with a very thin layer of CoFeB. This value is much lower than a desired thermal barrier of about 60 kT, which would be sufficient to ensure data retention in a large scale memory array.

Switching current of perpendicular MTJs can be significantly reduced because perpendicular MTJs can be patterned into a circular shape and thereby MTJ size can be decreased in comparison to the use of elliptically-patterned MTJs for in-plane MTJs to have sufficient shape anisotropy. However, the switching current density ($J_c$) of perpendicular MTJs with a very thin CoFeB free layer tends to increase because such films have a high damping constant ($\alpha$), a parameter which contributes directly to the switching current density $J_c$. Because switching current is switching current density $J_c$ times MTJ area, increased switching current density $J_c$ offsets switching current reduction from decreased MTJ area.

According to aspects of the present disclosure, a relatively thick layer of CoFeB may be used so the damping constant is not substantially increased. The CoFeB layer disclosed herein can exhibit PMA even though it does not have the very thin construction observed to exhibit PMA, as described above. Also because of the increased thickness, the described layers provide an increased volume that is sufficient to provide an acceptable thermal barrier.

According to aspects of the present disclosure, the effect of in-plane anisotropy may be overcome so that the thickness of the CoFeB layer can be increased without allowing the magnetic moments to align in the plane of the layer. According to one aspect, the in-plane anisotropy is overcome by adding layers to the memory cell that can apply a perpendicular magnetic anisotropy, ($K_u$) in the thicker CoFeB layer.

In one example, a relatively thick CoFeB free layer is provided. Without application of an additional perpendicular magnetic anisotropy, in-plane anisotropy in the relatively thick layer would cause the magnetic moments of the layer to stay in the film plane. According to aspects of the present disclosure, an assist layer that can be perpendicularly magnetized is added to the stack of layers along with the thick CoFeB layer in an MRAM cell. According to an aspect of the disclosure, the assist layer may be a very thin layer of CoFeB which can be perpendicularly magnetized. The assist layer may be coupled to the free layer by providing a PMA coupling layer between the assist layer and the free layer.

According to aspects of the present disclosure, the assist layer provides the additional interfacial anisotropy that is perpendicular to the free layer to overcome the in-plane anisotropy in the relatively thick layer. The additional free layer thickness that is provided by this configuration also provides sufficient volume, which results in an acceptable thermal barrier.

Aspects of the present disclosure provide a method for increasing thermal stability without increasing switching current of PMA type MRAM cells made with CoFeB. In one example, the thermal barrier ($E_b$) of a 20 Å thick layer of CoFeB coupled to an assist layer in a 40 nm×40 nm MRAM cell is estimated to be about 47 kT. This is a substantial improvement compared to the thermal barrier, $E_b$, of about 29 kT that is estimated for a very thin layer of CoFeB that exhibits PMA. In addition to providing an acceptable thermal barrier, this example provides an improved damping constant, α, and a corresponding switching current that is comparable to that observed using only the very thin layer of CoFeB to achieve PMA.

FIG. 1 is a cross-sectional diagram of an arrangement of layers of a representative magnetic tunnel junction (MTJ) structure 102 according to an aspect of the disclosure. The MTJ structure 102 includes a fixed PMA reference layer 104 and a tunnel barrier layer 106 deposited on the PMA reference layer 104. The PMA reference layer 104 may be a single layer of PMA-CoFeB, PMA-FeB, PMA-CoFe, FePt, FePd, or RE-TM alloy, for example. Alternatively, the PMA reference layer 104 may be a multilayer combination of Co and Pt, Co and Pd, or Co and Ni, for example. The PMA reference layer 104 may also be a synthetic anti-ferromagnetic (SAF) material composition, anti-ferromagnetic or synthetic anti-ferromagnetic materials such as CoFeB (and/or CoFe)/Ru/CoFeB (and/or CoFe), CoCrPt/Ru/CoFeB, (Co/Pt MLs)/Ru/CoFeB, PMA-multilayer/Ru/PMA-multilayer/CoFeB (and/or CoFe). The PMA reference layer 104 may also be a composite anti-ferromagnetic (AF)/SAF layer, for example. The tunnel barrier layer 106 may be MgO. A bottom free layer 108 is deposited on the tunnel barrier layer 106. The bottom free layer 108 may be a layer of PMA-CoFeB that has a thickness of less than about 20 Å, or may be a layer of PMA-FeB, for example. A top free layer 112 is deposited over the bottom free layer 108. The top free layer 112 may be another layer of PMA-CoFeB that has a thickness of less than about 20 Å or may be a layer of PMA-FeB or PMA-CoFe, for example.

A PMA coupling layer 110 is deposited between the bottom free layer 108 and the top free layer 112. The PMA coupling layer 110 may be a layer of Ru or Cr that provides a strong interlayer coupling between the bottom free layer 108 and the top free layer 112. Alternatively the PMA coupling layer 110 may be a layer of Cu, Pd or Pt that provides weak indirect interlayer coupling between the bottom free layer 108 and the top free layer 112. The PMA coupling layer 110 may also be a layer of thin metal such as Ta, Ti, Al or Hf, for example, or a thin-insulator such as MgO, TaOx, TiOx, HfOx or AlOx that provides interlayer coupling or neat netostatic coupling between the bottom free layer 108 and the top five layer 112. A PMA promotion layer 114 is deposited over the top free layer 112. The PMA promotion layer 114 may be a back end of line (BEOL) thermal cycle tolerant material such as MgO or AlOx with low electrical resistance*area (RA), Ru, Ta/MgO, AlOx/MgO, MgO/AlOx, Cr, Cr/MgO, Pd, Pd/MgO, Pt, or Pt/MgO. A cap layer 116 or hardmask may be deposited over the PMA promotion layer 114.

Alternatively, according to one aspect of the present disclosure (not shown) the PMA promotion layer 114 may be deposited between the bottom free layer 108 and the top free layer 112 instead of depositing the PMA coupling layer 110 between the bottom free layer 108 and the top free layer 112.

Figure 2:
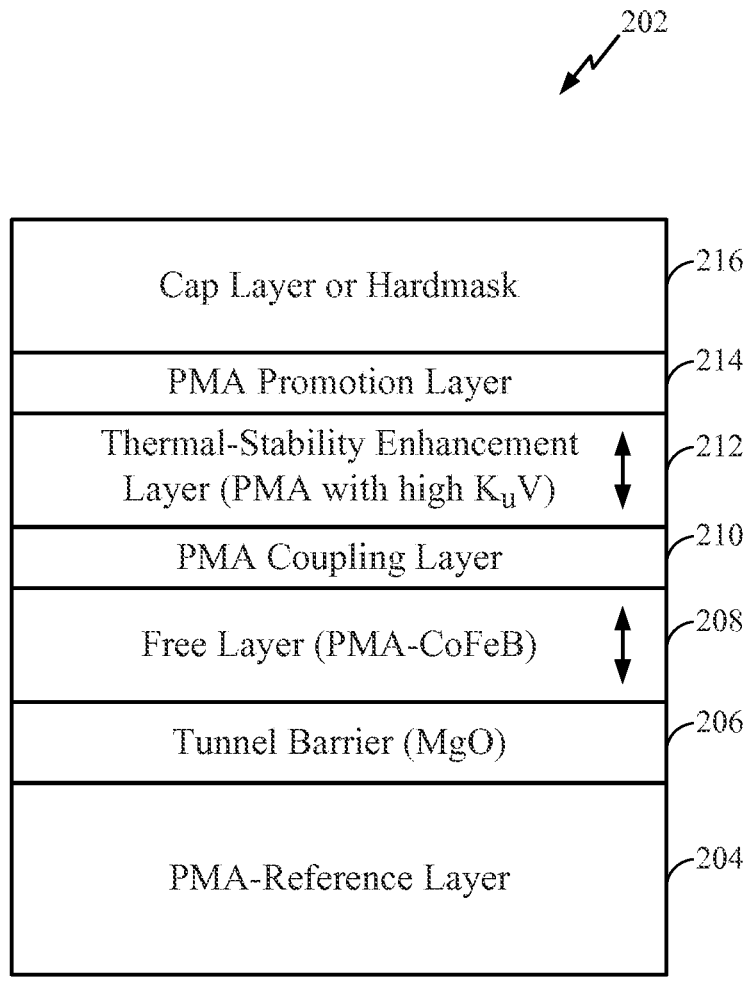
FIG. 2 is a cross-sectional diagram of a magnetic tunnel junction (MTJ) structure according to aspects of the present disclosure.

FIG. 2 is a cross-sectional diagram of an arrangement of layers of a representative magnetic tunnel junction (MTJ) structure 202 according to another aspect of the disclosure. The MTJ structure 202 includes a fixed PMA reference layer 204 and a tunnel barrier layer 206 deposited on the PMA reference layer 204. The PMA reference layer 204 may be a single layer of PMA-CoFeB, PMA-CoFe, FePt, FePd or RE-TM alloy, for example. Alternatively, the PMA reference layer 204 may be a multilayer layer combination of Co and Pt, Co and Pd, or Co and Ni, for example. The PMA reference layer 204 may also be a synthetic anti-ferromagnetic (SAF) material composition, anti-ferromagnetic or synthetic anti-ferromagnetic materials such as CoFeB (and/or CoFe)/Ru/CoFeB (and/or CoFe), CoCrPt/Ru/CoFeB, (Co/Pt MLs)/Ru/CoFeB. The PMA reference layer 204 may also be a composite anti-ferromagnetic (AF)/SAF layer, for example. The tunnel barrier layer 206 may be MgO.

A free layer 208 is deposited on the tunnel barrier layer 206. The free layer 208 may be a layer of PMA-CoFeB or PMA-FeB that has a thickness of less than about 20 Å, for example. A thermal stability enhancement layer 212 having PMA material with high energy barrier ($K_uV$) is deposited over the free layer 208. The thermal stability enhancement layer 212 may be a layer of PMA-CoFeB or may be a layer of PMA-CoFe with high $K_uV$ for example, which may be tuned by varying its thickness or composition or by a PMA promotion layer.

A PMA coupling layer 210 is deposited between the free layer 208 and thermal stability enhancement layer 212. The PMA coupling layer 210 may be a layer of Ru, Cr or thin Ta that provides a strong interlayer coupling between the free layer 208 and the thermal stability enhancement layer 212. A PMA promotion layer 214 is deposited over the thermal stability enhancement layer 212. The PMA promotion layer 214 may be a back end of line (BEOL) thermal cycle tolerant material such as MgO or AlOx with low RA, Ru, Ru/MgO, Ta/MgO, AlOx/MgO, MgO/AlOx, Cr, Cr/MgO, Pd, Pd/MgO, Pt or Pt/MgO. A cap layer 216 or hardmask may be deposited over the PMA promotion layer 214.

Figure 3:
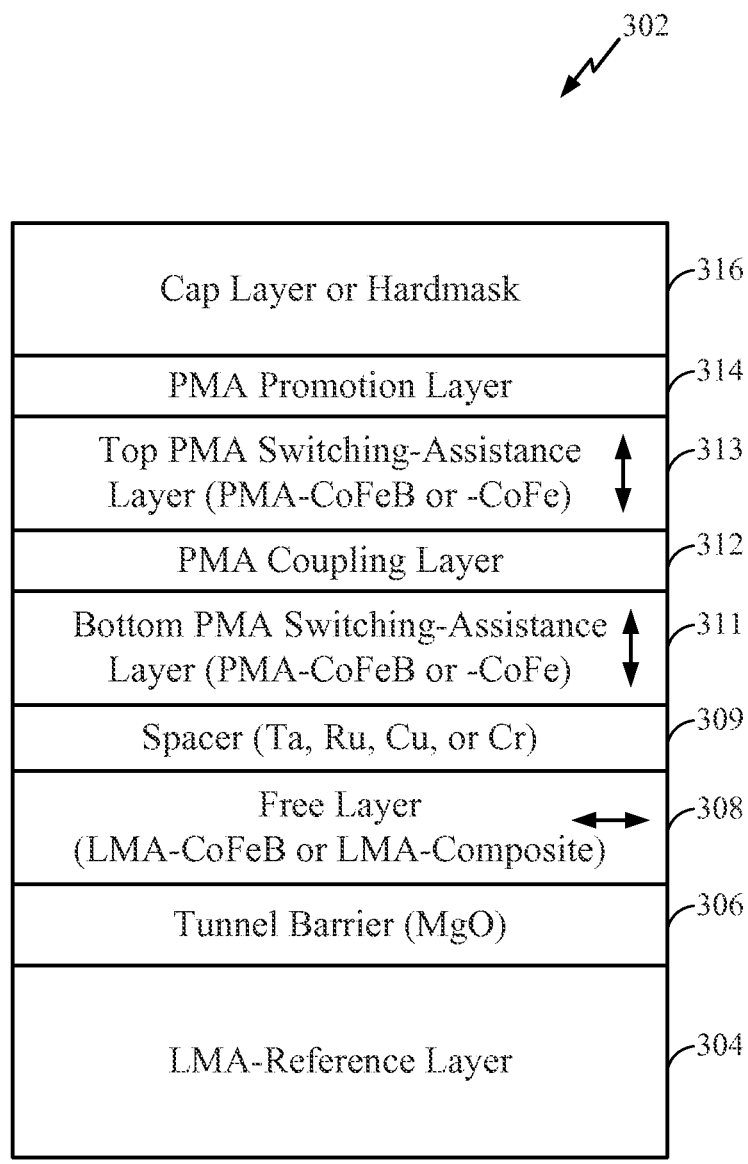
FIG. 3 is a cross-sectional diagram of a magnetic tunnel junction (MTJ) structure according to aspects of the present disclosure.

FIG. 3 is a cross-sectional diagram of layers of a representative magnetic tunnel junction (MTJ) structure 302 according to another aspect of the disclosure. The MTJ structure 302 includes a longitudinal magnetic anisotropy (LMA) fixed reference layer 304 and a tunnel barrier layer 306 that is deposited on the LMA reference layer 304. The LMA reference layer 304 may be an AF/SAF multilayer such as PtMn/(CoFe and/or CoFeB)/Ru/(CoFeB and/or CoFe). The tunnel barrier layer 306 may be MgO. An LMA free layer 308 is deposited on the tunnel barrier layer 306. The LMA free layer 308 may he a layer LMA-CoFeB or other LMA composite. A spacer layer 309 of Ta, Ru, Cu, Cr or a thin-insulator such as MgO, or AlOx may be deposited over the LMA free layer 308.

A bottom PMA switching assistance layer 311 is deposited over the LMA free layer 308 and/or the spacer layer 309. The bottom PMA switching assistance layer 311 may be a layer of PMA-CoFeB that has a thickness of less than about 20 Å, for example. A top PMA switching assistance layer 313 is deposited over the bottom PMA switching assistance layer 311. The PMA switching assistance layer 313 may he another layer of PMA-CoFeB that has a thickness of less than about 20 Å or may be a layer of PMA-CoFe, for example.

A PMA coupling layer 312 is deposited between the bottom PMA switching assistance layer 311 and the top PMA switching assistance layer 313. The PMA coupling layer 312 may be a layer of Ru or Cr that provides a strong interlayer coupling between the bottom PMA switching assistance layer 311 and the top PMA switching assistance layer 313. Alternatively, the PMA coupling layer 312 may be a layer of Cu, Pd or Pt that provides weak indirect interlayer coupling between the bottom PMA switching assistance layer 311 and the top PMA switching assistance layer 313. The PMA coupling layer 312 may also be a layer of thin metal such as Ta, Ti, Al or Hf, for example, or a thin-insulator such as MgO, TaOx, TiOx, HfOx or AlOx that provides interlayer coupling or magnetostatic coupling between the bottom PMA switching assistance layer 311 and the top PMA switching assistance layer 313.

A PMA promotion layer 314 is deposited over the top PMA switching assistance layer 313. The PMA promotion layer 314 may be a back end of line (BEOL) thermal cycle tolerant material such as MgO or AlOx with low RA, Ru, Ru/MgO, Ta/MgO, AlOx/MgO, MgO/AlOx, Cr, Cr/MgO, Pd, Pd/MgO, Pt or Pt/MgO. A cap layer 316 or hardmask may be deposited over the PMA promotion layer 314.

Alternatively, according to one aspect of the present disclosure (not shown) the PMA promotion layer 314 may be deposited between the bottom PMA switching assistance layer 311 and the top PMA switching assistance layer 313 instead of depositing the PMA coupling layer 312 between the bottom PMA switching assistance layer 311 and the top PMA switching assistance layer 313.

The two PMA switching assistance layers 311, 313 of the MTJ structure 302, which are coupled by a PMA coupling layer 312, reduce switching current density of the longitudinal magnetic anisotropy (LMA) free layer 308.

In one configuration, an MTJ includes means for fixing magnetization in a first layer, means for providing tunneling magnetoresistance (TMR) in a second layer, and means for increasing perpendicular magnetic anisotropy (PMA) in a composite layer. In this configuration, the composite layer includes a first means for increasing PMA, a second means for increasing PMA, and a means for coupling the first means for increasing PMA and the second means for increasing PMA. This configuration may also include means for promoting PMA in a fourth layer coupled to the composite layer.

Referring to FIG. 1, the means for fixing magnetization may be the PMA-Reference Layer 104, for example. The means for providing TMR may be the Tunnel Barrier layer 106, for example. The means for increasing PMA may be a composite layer including the bottom free layer 108 being the first means for increasing PMA, the top free layer 112 being the second means for increasing PMA and the PMA coupling layer 110 being the means for coupling the first means for increasing PMA and the second means for increasing PMA. The means for promoting PMA may be the PMA promotion layer 114, for example.

Although specific means have been set forth, it will be appreciated by those skilled in the art that not all of the disclosed means are required to practice the disclosed configurations. Moreover, certain well known means have not been described, to maintain focus on the disclosure.

Figure 4:
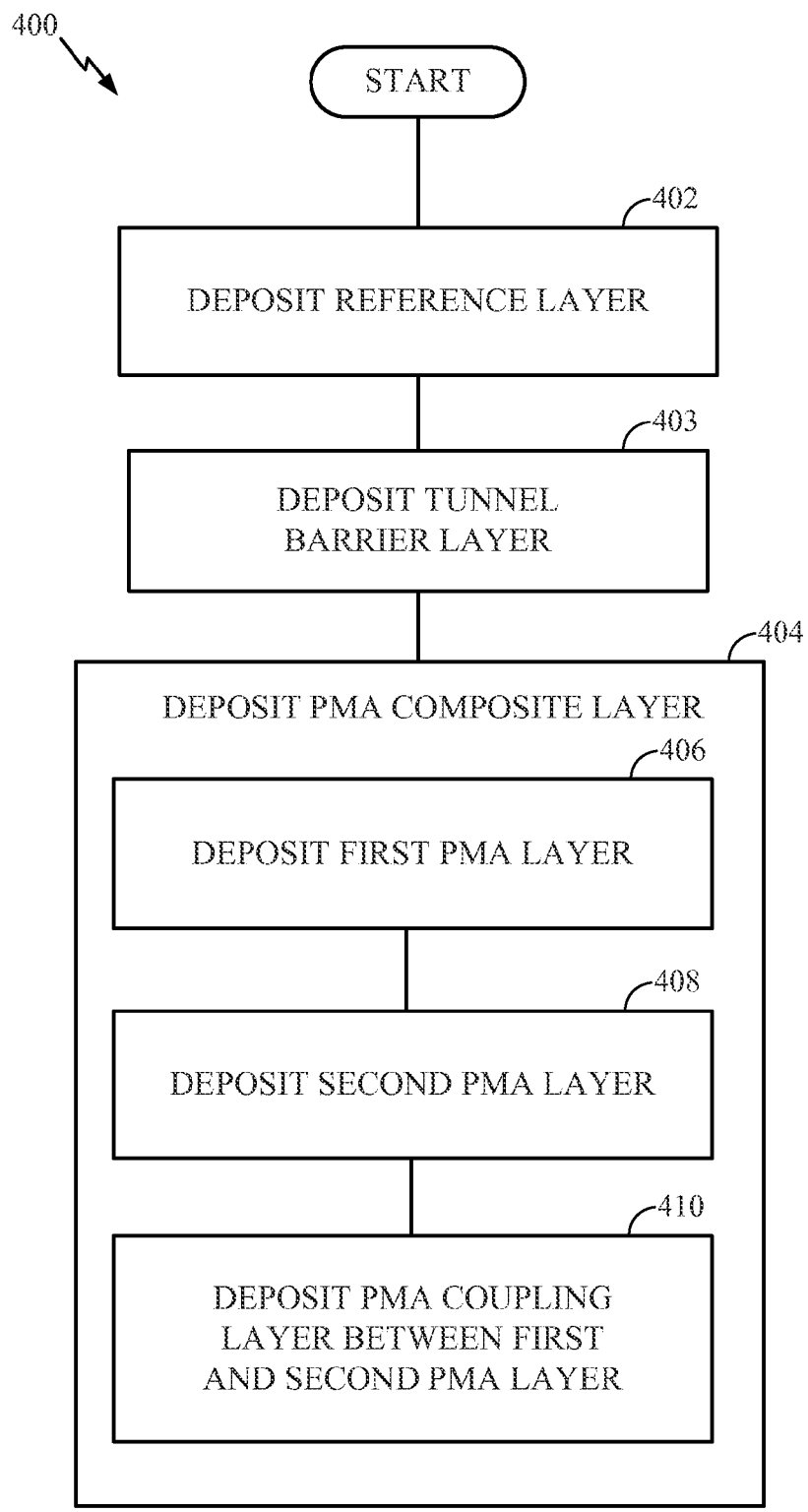
FIG. 4 is process flow diagram illustrating a method of increasing thermal stability in PMA type MRAM cells according to aspects of the present disclosure.

FIG. 4 is a process flow diagram illustrating a method of constructing a perpendicular MTJ. The method includes depositing a reference layer in block 402, depositing a tunnel barrier layer in block 403 and depositing a composite PMA layer in block 404. The tunnel barrier layer is deposited between the reference layer and the composite PMA layer. Depositing the composite PMA layer in block 404 includes depositing a first PMA layer in block 406, depositing a second PMA layer in block 408 and depositing a PMA coupling layer between the first PMA layer and the second PMA layer in block 410.

Figure 5:
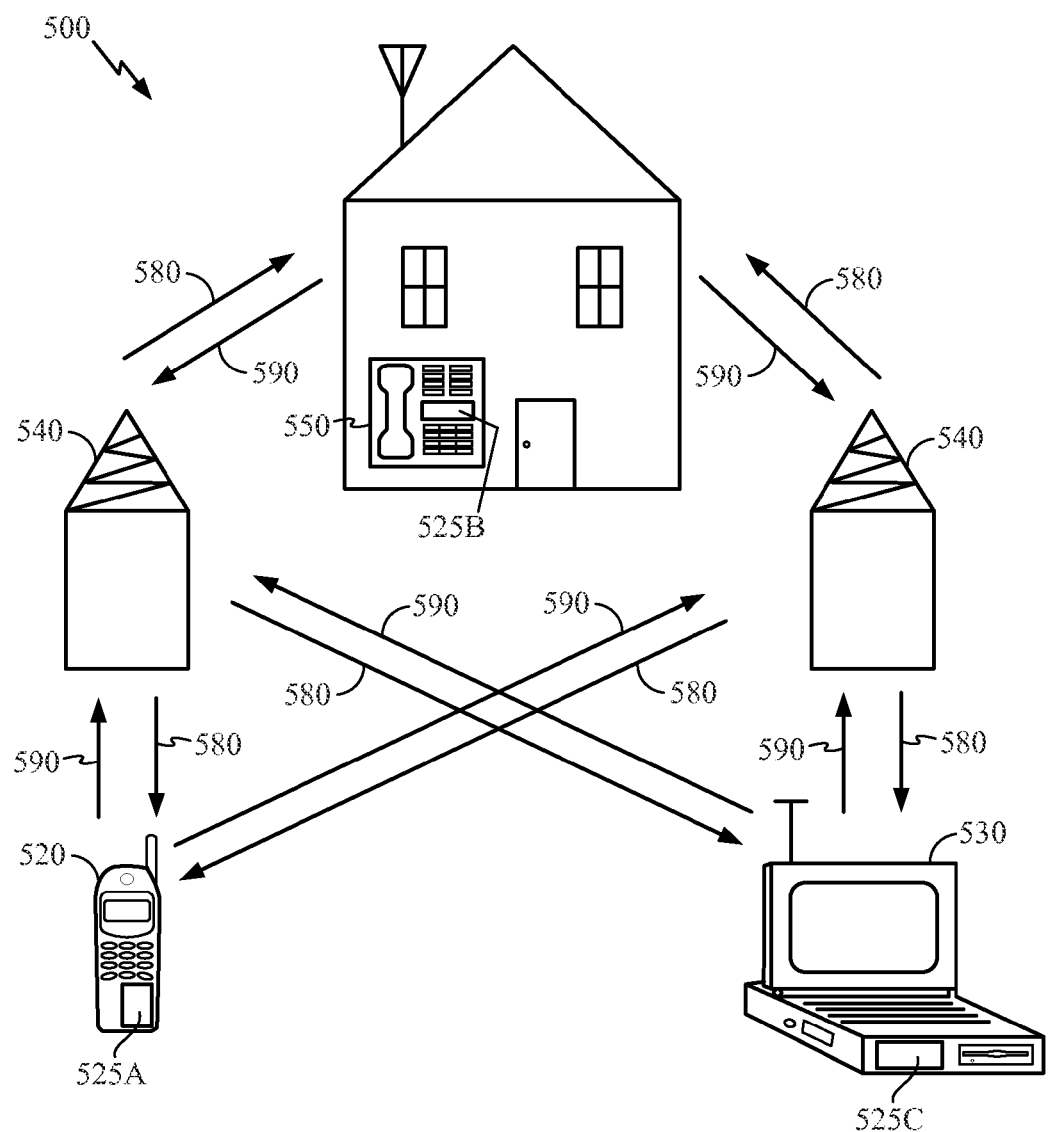
FIG. 5 is a block diagram showing an exemplary wireless communication system in which an aspect of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C and 525B that include the disclosed MRAM. It will be recognized that other devices may also include the disclosed MRAM, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the teachings of the disclosure, the disclosure is not limited to these exemplary illustrated units. Aspects of the disclosure may be suitably employed in many devices which include MRAM.

Figure 6:
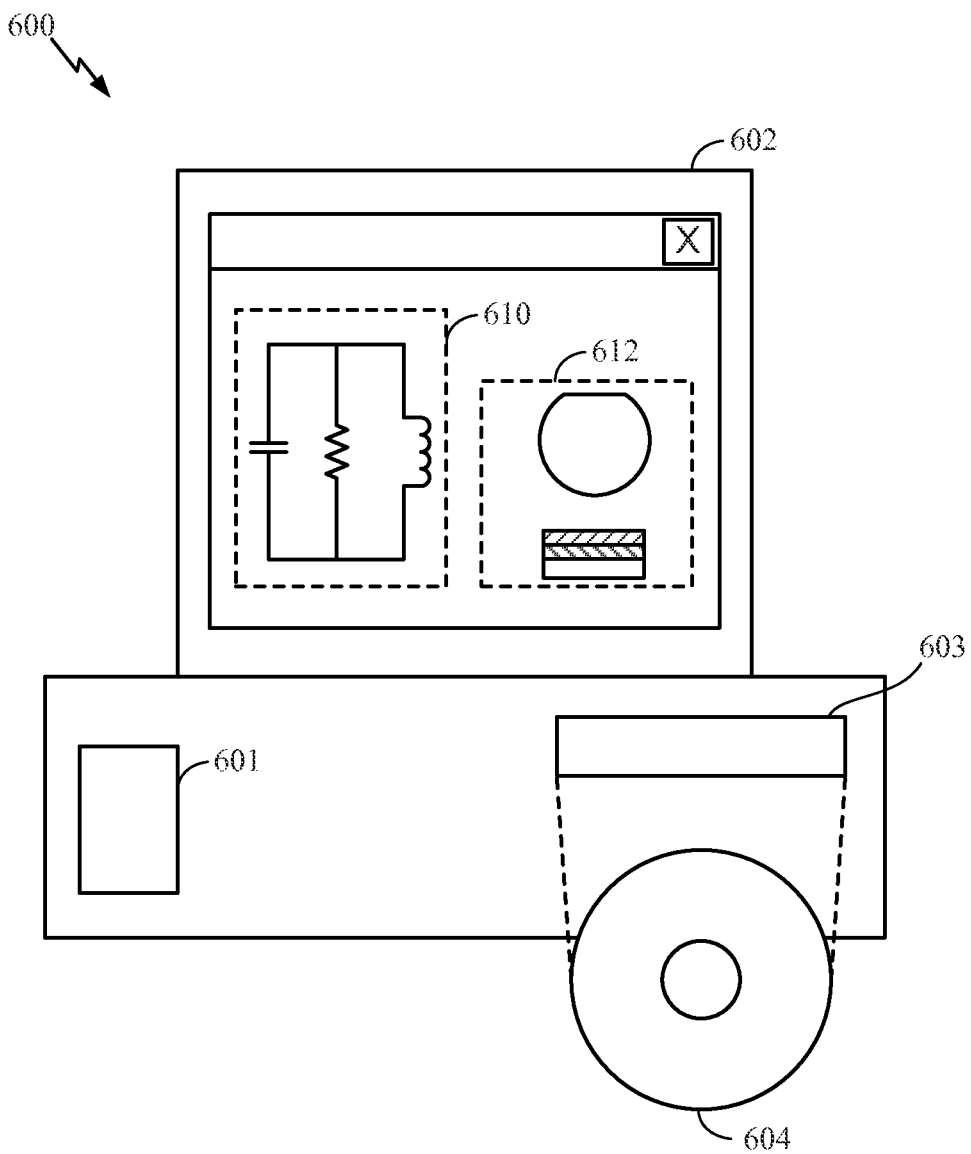
FIG. 6 is a block diagram illustrating a design workstation used for circuit, layout, and logic design of a semiconductor component according to one aspect.

FIG. 6 is a block diagram illustrating a design workstation used for circuit, layout, and logic design of a semiconductor component, such as the MRAM disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as an MRAM. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A magnetic tunnel junction (MTJ) comprising:
   a reference layer;
   a composite perpendicular magnetic anisotropy (PMA) layer including a first PMA free layer, a PMA assist layer, and a PMA coupling layer between the first PMA free layer and the PMA assist layer, the coupling layer abutting the first PMA free layer and the PMA assist layer;
   a tunnel barrier layer between the reference layer and the composite PMA layer;
   a longitudinal magnetic anisotropy (LMA) free layer between the tunnel barrier layer and the composite PMA layer;
   a spacer layer between the LMA free layer and the composite PMA layer;
   a PMA promotion layer coupled to the composite PMA layer, the PMA promotion layer abutting the PMA assist layer; and
   a hard mask layer abutting the PMA promotion layer.

2. The MTJ of claim 1, in which the first PMA free layer material is CoFeB.

3. The MTJ of claim 2, in which the PMA free layer comprises a thickness of less than 2 nanometers.

4. The MTJ of claim 1, in which at least one of the first PMA free layer and the-PMA assist layer comprises a thermal stability enhancement layer.

5. The MTJ of claim 1, in which the reference layer comprises a PMA reference layer.

6. The MTJ of claim 1, integrated in at least one of a mobile phone, a set top box, a music player, a video player, an entertainment unit, a navigation device, a computer, a hand-held personal communication systems (PCS) unit, a portable data unit, and a fixed location data unit.

7. The MTJ of claim 1, in which the PMA coupling layer is made from Ru, Cr and/or Ta.

8. A method of constructing a perpendicular MTJ, comprising:
   depositing a reference layer;
   depositing a composite perpendicular magnetic anisotropy (PMA) layer including a first PMA free layer, a PMA assist layer, and a PMA coupling layer between the first PMA free layer and the PMA assist layer, the coupling layer abutting the first PMA free layer and the PMA assist layer;
   depositing a tunnel barrier layer between the reference layer and the composite PMA layer;
   depositing a longitudinal magnetic anisotropy (LMA) free layer between the tunnel barrier layer and the composite PMA layer;
   depositing a spacer layer between the LMA free layer and the composite PMA layer;
   depositing a PMA promotion layer on the composite PMA layer, the PMA promotion layer abutting the PMA assist layer; and
   depositing a hard mask layer on the PMA promotion layer, the hard mask layer abutting the PMA promotion layer.

9. The method of claim 8, further comprising integrating the MTJ into at least one of a mobile phone, a set top box, a music player, a video player, an entertainment unit, a navigation device, a computer, a hand-held personal communication systems (PCS) unit, a portable data unit, and a fixed location data unit.

10. The method of claim 8, in which the PMA coupling layer is made from Ru, Cr and/or Ta.

11. A magnetic tunnel junction (MTJ) comprising:
    a longitudinal magnetic anisotropy (LMA) reference layer;
    a tunnel barrier layer on the LMA reference layer, the tunnel barrier layer abutting the reference layer
    an LMA free layer on the tunnel barrier layer, the LMA free layer abutting the tunnel barrier layer;
    a spacer layer on the LMA free layer, the spacer layer abutting the LMA free layer;
    a first perpendicular magnetic anisotropy (PMA) switching assist layer on the spacer layer, the first PMA switching assist layer abutting the spacer layer;
    a PMA coupling layer on the first PMA switching assist layer, the PMA coupling layer abutting the first PMA switching assist layer;
    a second PMA switching assist layer on the PMA coupling layer, the second PMA switching assist layer abutting the PMA coupling layer;
    a PMA promotion layer on the second PMA switching assist layer, PMA promotion layer abutting the second PMA switching assist layer;
    a hard mask layer on the PMA promotion layer, the hard mask layer abutting the PMA promotion layer.

12. The MTJ of claim 11, in which the first PMA switching assist layer material and/or the second PMA switching assist layer material is CoFeB.

13. The MTJ of claim 11, in which the first PMA switching assist layer and the second PMA switching assist layer each comprise a thickness of less than 2 nanometers.

14. The MTJ of claim 11, in which the first PMA switching assist layer and/or the second PMA switching assist layer comprises a thermal stability enhancement layer.

15. The MTJ of claim 11, in which the PMA coupling layer is made from Ru, Cr and/or Ta.

16. The MTJ of claim 11, integrated in at least one of a mobile phone, a set top box, a music player, a video player, an entertainment unit, a navigation device, a computer, a handheld personal communication systems (PCS) unit, a portable data unit, and a fixed location data unit.

* * * * *